(12) United States Patent
Tsai

(10) Patent No.: US 10,008,441 B2
(45) Date of Patent: Jun. 26, 2018

(54) SEMICONDUCTOR PACKAGE

(71) Applicant: MEDIATEK INC., Hsin-Chu (TW)

(72) Inventor: Shiann-Tsong Tsai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 27 days.

(21) Appl. No.: 15/349,113

(22) Filed: Nov. 11, 2016

(65) Prior Publication Data
US 2017/0179017 A1 Jun. 22, 2017

Related U.S. Application Data

(60) Provisional application No. 62/268,624, filed on Dec. 17, 2015.

(51) Int. Cl.
H01L 29/49 (2006.01)
H01L 23/498 (2006.01)
H01L 23/367 (2006.01)
H01L 23/31 (2006.01)
H01L 23/373 (2006.01)

(52) U.S. Cl.
CPC .... *H01L 23/49838* (2013.01); *H01L 23/3128* (2013.01); *H01L 23/3157* (2013.01); *H01L 23/3675* (2013.01); *H01L 23/3736* (2013.01)

(58) Field of Classification Search
CPC ............ H01L 23/4952; H01L 21/4825
See application file for complete search history.

(56) References Cited

U.S. PATENT DOCUMENTS

| 6,445,594 B1 | 9/2002 | Nakagawa et al. |
| 2007/0080466 A1 | 4/2007 | Chou et al. |
| 2015/0028471 A1* | 1/2015 | Lin .................. H01L 23/49811 257/737 |
| 2015/0041975 A1* | 2/2015 | Chung ............... H01L 25/0657 257/737 |

FOREIGN PATENT DOCUMENTS

| JP | H11297738 | 10/1999 |
| JP | 2009231296 | 10/2009 |
| KR | 2010 0053189 | 5/2010 |

* cited by examiner

*Primary Examiner* — Michael Shingleton
(74) *Attorney, Agent, or Firm* — McClure, Qualey & Rodack, LLP

(57) ABSTRACT

A semiconductor package includes a circuit board, a semiconductor chip, a heat spreading layer, an encapsulant layer, a plurality of conductive connections, and a plurality of solder balls. The circuit board includes opposite first and second surfaces and a plurality of through holes. The semiconductor chip is formed over a center portion of the first surface of the circuit board, having an active surface facing the circuit board. The heat spreading layer is formed over the semiconductor chip. The encapsulant layer is formed over the circuit board, covering heat spreading layer, the semiconductor chip, and the circuit board. The plurality of conductive connections respectively passes through the through holes and electrically connecting the semiconductor chip with the circuit board. The plurality of solder balls are formed over the second surface of the circuit board.

29 Claims, 7 Drawing Sheets

SEMICONDUCTOR PACKAGE

CROSS REFERENCE TO RELATED APPLICATIONS

This application claims the benefit of U.S. Provisional Application No. 62/268,624, filed on Dec. 17, 2015, the entirety of which is incorporated by reference herein.

BACKGROUND OF THE INVENTION

Field of the Invention

The present invention relates to integrated circuit (IC) devices, and particularly to a semiconductor package with reduced IR drop effects and more flexible bond-pad designs.

Description of the Related Art

A typical ball grid array (BGA) semiconductor package includes a semiconductor chip mounted on the upper surface of an insulating printed circuit board substrate. The substrate may be made of a glass-fiber filled organic laminate, such as an FR4 board, FR5 board, or BT board, and have interconnected conductive circuit patterns on the upper and lower surfaces thereof. A hardened encapsulating material covers the chip, the upper surface of the substrate, and electrical conductors, such as bond wires, that extend between the chip and the circuit patterns on the upper surface of the substrate. Conductive balls or other input/output terminals are formed on the circuit patterns of the lower surface of the substrate.

However, while existing BGA semiconductor packages have been generally adequate for their intended purposes, they have not been entirely satisfactory in every respect.

BRIEF SUMMARY OF THE INVENTION

An exemplary semiconductor package comprises a circuit board, a semiconductor chip, a heat spreading layer, an encapsulant layer, a plurality of conductive connections, and a plurality of solder balls. The circuit board comprises opposite first and second surfaces and a plurality of through holes. The semiconductor chip is formed over a center portion of the first surface of the circuit board, having an active surface facing the circuit board. The heat spreading layer is formed over the semiconductor chip. The encapsulant layer is formed over the circuit board, covering heat spreading layer, the semiconductor chip, and the circuit board. The plurality of conductive connections respectively pass through the through holes and electrically connecting the semiconductor chip with the circuit board. The plurality of solder balls are formed over the second surface of the circuit board.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
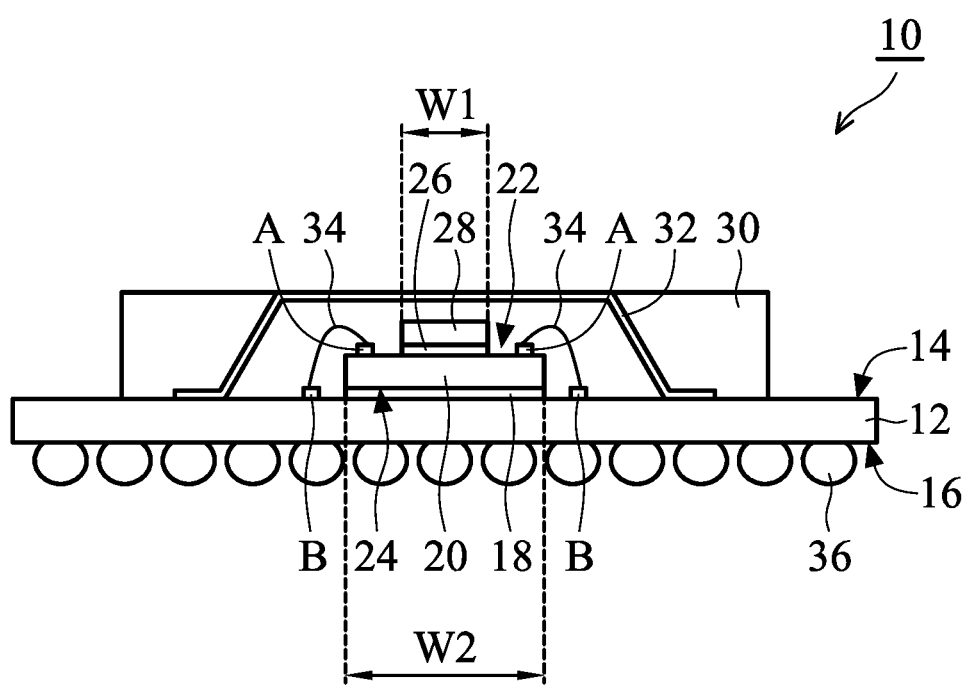
FIG. 1 is a schematic cross section of a semiconductor package in accordance with an embodiment of the present invention.

FIG. 1 shows a schematic cross section of an exemplary semiconductor package 10, comprising a circuit board 12, a semiconductor chip 20, a spacer 28, an encapsulant layer 30, a heat spreading layer 32, and a plurality of conductive elements 36.

As shown in FIG. 1, the semiconductor chip 20 is, for example, a functional chip such as a microprocessor chip, a memory chip, a logic chip or other functional chips, and has an active first surface 22 and an inactive second surface 24. The first surface 22 of the semiconductor chip 20 comprises a plurality of input/output pads A located adjacent to the peripheral edges of first surface 22. The semiconductor chip 20 may be thinned by polishing the second surface 24. In one embodiment, the semiconductor chip 20 may have a thickness of about 4-8 mil.

The semiconductor chip 20 is mounted over a center portion of the circuit board 12 through a first adhesive layer 18. The circuit board 12 has opposing first and second surfaces 14 and 16, and the first adhesive layer 18 and the semiconductor chip 20 are sequentially formed over the center portion of the first surface 14 of the circuit board 12. The circuit board 12 is mainly composed of a resin layer (not shown) formed from BT (bismaleimide triazine) board, FR4 board, FR5 board, or some other glass-fiber filled organic (e.g., epoxy) laminate of the type used to make printed circuit board substrates for semiconductor packages. In addition, conductive traces and conductive interconnects (both not shown) are also formed in the circuit board 12, thereby providing suitable electrical connections between the semiconductor chip 20 and the conductive elements 36. The first adhesive layer 18 may comprise epoxy or the like.

As shown in FIG. 1, a plurality of bonding pads B and electrically conductive circuit patterns (not shown) are formed on the first surface 14 of the circuit board 12, and the conductive elements 36 are formed on the second surface 16 of the circuit board 12. Each input/output pad A of the semiconductor chip 20 is electrically connected to one of the bonding pads B by a conductive connection 34, which spans between the semiconductor chip 20 and the bonding pads. As shown in FIG. 1, the conductive connection 34 may be a bond wire formed of gold or aluminum.

In addition, the spacer 28 is mounted over a center portion of the first surface 22 of the semiconductor chip 20 through a second adhesive layer 26. The spacer 28, for example, is a rectangular non-functional chip made of a blank semiconductor wafer, and may comprise a semiconductor material which is the same as that of the semiconductor layer (not shown) of the semiconductor chip 20. The spacer 28 is formed with a cross-sectional dimension, for example a width W1 that is smaller than that of the cross-sectional dimension, or a width W2 of the semiconductor chip 20. In one embodiment, the spacer 28 is formed with a thickness of about 4-10 mil.

The encapsulant layer 30 covers the first surface 22 of the semiconductor chip 20, portions of the first surface 14 of the circuit board 12, and portions of the heat spreading layer 32, so that a portion of the top surface of the heat spreading layer 32 over the spacer 26 and the semiconductor chip 20 is exposed. The encapsulant layer 30 also fills the space between the heat spreading layer 32 and the spacer 26 and the heat spreading layer 32. The encapsulant layer 30 may be formed by molding and curing a resin material (e.g., epoxy), or by pouring and curing a liquid resin material (e.g., epoxy). The heat spreading layer 32 can be formed with, for example, the Ω-like shape shown in FIG. 1 having portions contacting the circuit board 12 and may be formed of copper, aluminum, or another metal alloy.

The conductive elements 36, for example, are made of lead tin solder or some other metal, and serve as input/output (I/O) terminals for the semiconductor package 10. The conductive elements 36 are each electrically connected to a respective input/output pad A of the semiconductor chip 20 through the connective connections 34, the bonding pad B formed over the circuit board 12, and the conductive traces and conductive interconnects (both not shown) formed in the circuit board 12. The conductive elements 36 allow the semiconductor package 10 to be mounted on a motherboard (not shown). Other configurations of input/output terminals are possible.

Figure 2:
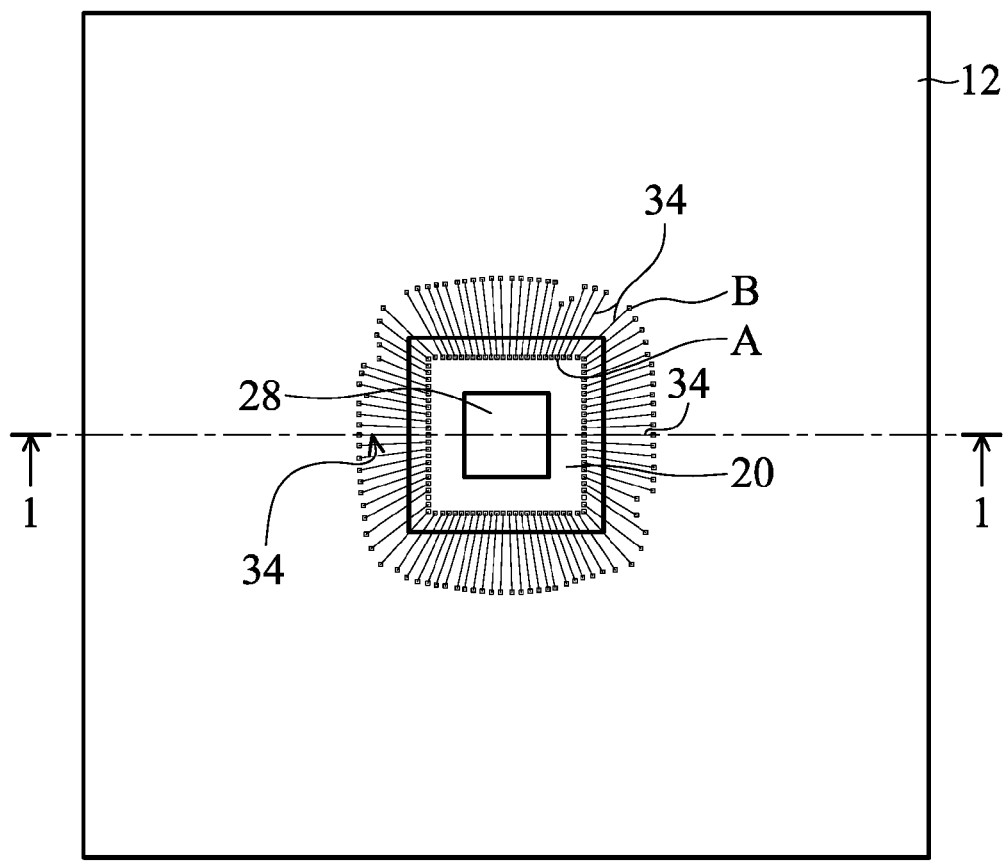
FIG. 2 is a schematic top view of the semiconductor package shown in FIG. 1.

FIG. 2 shows a schematic top view of the semiconductor package 10 shown in FIG. 1, and FIG. 1 shows the schematic cross section taken along line 1-1 in FIG. 2. In FIG. 2, the heat spreading layer 32 and the encapsulant layer 30 are not shown, and the circuit board 12, the semiconductor chip 20, the spacer 28 and the connective connections 34 are illustrated, for the purpose of simplicity.

As shown in FIG. 2, the connective connections 34 are provided on the first surface 22 of the semiconductor chip 20 for electrically connecting the input/output pads A formed around the peripheral edges of the semiconductor chip 20 with the bonding pads B formed over the first surface 12 of the package substrate 12.

In the exemplary semiconductor package 10 shown in FIGS. 1-2, since the input/output pads A are all located on the first surface 22 of the semiconductor chip 20 around the peripheral edges thereof, so that the conductive connections 34 will be provided between the input/output pads A of the semiconductor chip 20 and the bonding pads B formed over the package substrate 12 in a dense configuration. Therefore, the semiconductor chip 20 will be provided with a larger size for accommodating more input/output pads A of the semiconductor chip 20 and preventing short-circuits between the adjacent conductive connections 34, as the trend for increasing the number of active or passive components within the semiconductor chip 20.

In addition, since all the input/output pads A are on the first surface 22 of the semiconductor chip 20 around the peripheral edges thereof, the semiconductor chip 20 needs to be formed with even more complex interconnect structures to link active or passive components located at, for example, a central portion of the semiconductor chip 20 with the input/output pads A, meaning that fabrication of the semiconductor chip 20 will become more complex and the length of the path between the active or passive components formed in the semiconductor chip 20 and the input/output pad A around the peripheral edges of the first surface 22 of the semiconductor chip 20 may be too long. Therefore, undesired IR drop effects may happen to the active or passive components located at, for example, the central portion in the semiconductor chip 20 of semiconductor package 10 and performances of the semiconductor package 10 is thus affected.

Thus, an improved semiconductor package with reduced IR drop effects is needed.

Figure 3:
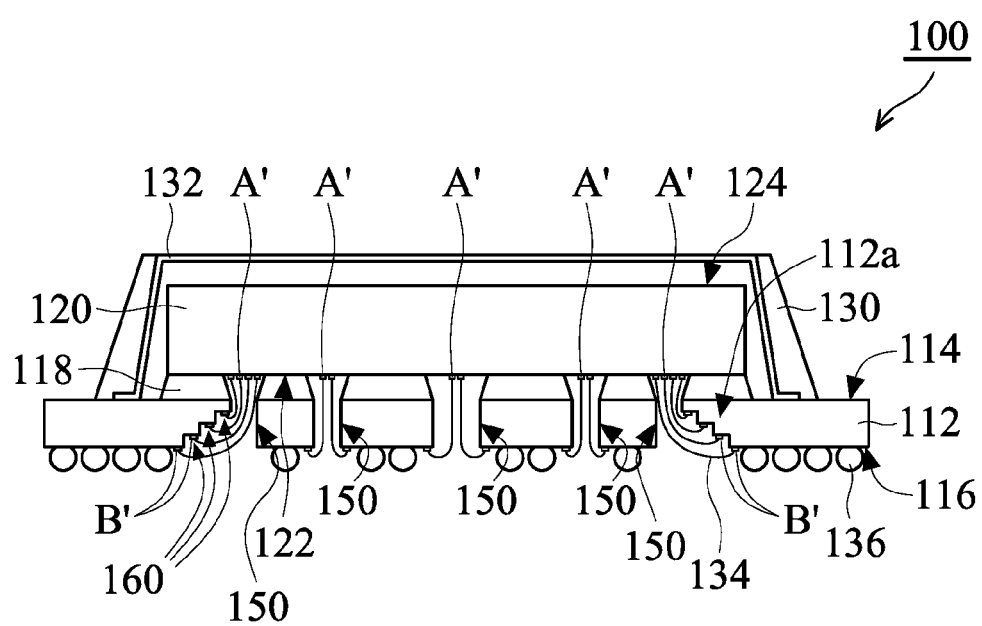
FIG. 3 is a schematic cross section of a semiconductor package in accordance with another embodiment of the present invention.

FIG. 3 shows an exemplary semiconductor package 100 with reduced IR drop effects, comprising a circuit board 112, a semiconductor chip 120, an encapsulant layer 130, a heat spreading layer 132, and a plurality of conductive elements 136.

As shown in FIG. 3, the semiconductor chip 120 is, for example, a functional chip such as a microprocessor chip, a memory chip, a logic chip or other functional chips, and has an active first surface 122 and an inactive second surface 124. The first surface 122 of the semiconductor chip 120 comprises a plurality of input/output pads A' located adjacent to the peripheral edges of first surface 122. The semiconductor chip 120 may be thinned by polishing the second surface 124. In one embodiment, the semiconductor chip 120 may have a thickness of about 4-18 mil.

The circuit board 112 has opposing first and second surfaces 114 and 116, and the adhesive layer 118 and the semiconductor chip 120 are sequentially formed over the center portion of the first surface 114 of the circuit board 112. The circuit board 112 is mainly composed of a resin layer (not shown) formed from BT (bismaleimide triazine) board, FR4 board, FR5 board, or some other glass-fiber filled organic (e.g., epoxy) laminate of the type used to make printed circuit board substrates for semiconductor packages. In addition, multiple layers of conductive traces and conductive interconnects (both not shown) are also formed in the circuit board 112, thereby providing suitable electrical connections between the semiconductor chip 120 and the conductive elements 136. The first adhesive layer 118 may comprise epoxy or the like.

As shown in FIG. 3, the semiconductor chip 120 is mounted over a center portion of the circuit board 112 through the first adhesive layer 118, and the first surface 122 of the semiconductor chip 120 faces the circuit board 112. The first surface 122 of the semiconductor chip 120 comprises a plurality of input/output pads A' located not only at the peripheral edges of first surface 122 but also at a central portion of the first surface 122.

In addition, a plurality of through holes 150 is provided in the circuit board 112 to form through both center and peripheral portions of the circuit board 112. In addition, the through holes 150 also form through a portion of the first adhesive layer 118 to expose a plurality of the input/output pads A' formed on the first surface 122 of the semiconductor chip 120. As shown in FIG. 3, the peripheral portion of the circuit board 112, which is close to the peripheral edge of the first surface 122 of the semiconductor chip 120, is designed to include a stair-like portion 112a. The stair-like portion 112a has a plurality of sub-layers 160 formed vertically between the first surface 114 and the second surface 116 and exposed by the through hole 150. Also, the sub-layers 160 of the stair-like portion 112a are not coplanar with the first surface 114 and the second surface 116 of the circuit board 112. The through holes 150 may also expose conductive traces and conductive interconnects (both not shown) formed in the plurality of sub-layers 160 of the circuit board 120, and a plurality of bonding pads B' can be formed on the conductive traces and conductive interconnects (both not shown) formed in each of the plurality of sub-layers 160 of the circuit board 120 exposed by the through holes 150. The conductive elements 136 are formed on the second surface 116 of the circuit board 112.

Moreover, one or more conductive connections 134 may be provided within the through holes 150 and spans between the input/output pads A' and the bonding pads B' to electrically connect the semiconductor chip 120 with the circuit board 112. As shown in FIG. 3, the conductive connections 134 may be a bond wire formed of gold or aluminum.

In addition, the encapsulant layer 130 covers the second surface 124 of the semiconductor chip 120 and portions of the heat spreading layer 132, so that a portion of the top surface of the heat spreading layer 132 over the semiconductor chip 20 is exposed. The encapsulant layer 130 also fills the space between the heat spreading layer 132 and the heat spreading layer 132. In addition, the encapsulant layer 130 also fills the through holes 150 and covers the conductive connections 134, the bonding pads B', and the input/output pads A' exposed by the through holes 150. The encapsulant layer 130 may be formed by molding and curing a resin material (e.g., epoxy), or by pouring and curing a liquid resin material (e.g., epoxy). The heat spreading layer 132 can be formed with, for example, the Ω-like shape as shown in FIG. 3 having portions contacting the circuit board 112 and may be formed of copper, aluminum, or another metal alloy.

As shown in FIG. 3, since the semiconductor chip 120 is mounted over the circuit board 112 by facing the active first surface 122 toward the circuit board 112, so that the heat spreader layer 132 can be directly disposed over the inactive surface 124 of the semiconductor chip 132 without an additional thermal conductive spacer formed therebetween. Accordingly, the thickness of the semiconductor package 100 can be reduced. In addition, the conductive elements 136, for example, are made of lead tin solder or some other metal, and serve as input/output terminals for the semiconductor package 110. The conductive elements 136 are each electrically connected to a respective input/output pad A' of the semiconductor chip 120 through the connective connections 134, and the bonding pads B' formed on the conductive traces and conductive interconnects (both not shown) formed in the sub-layers 160 of the stair-like portion 112a of the circuit board 112 exposed by the through holes 150. The conductive elements 136 allow the semiconductor package 110 to be mounted on a motherboard (not shown). Other configurations of input/output terminals are possible.

In the exemplary semiconductor package 100 shown in FIG. 3, IR drop effect in the semiconductor chip 120 can be reduced since additional input/output pad A are provided on at least the central portion of first surface 122, so that connective connections 134 such as bonding wires can be provided between the input/output pad A' of the semiconductor chip 120 on both central and peripheral portions of first surface 122 of the second semiconductor chip 120 and the sub-layers 160 of the stair-like portion 112a of the circuit board 112 exposed by the through holes 150.

Moreover, since the input/output pad A' are located on both central and peripheral portions of first surface 122 of the semiconductor chip 120, so that interconnect structures provided in the semiconductor chip 120 can be designed with a relatively simple routing structure to link the active or passive components located at the central portion semiconductor chip 120 with the input/output pad A'. Therefore, fabrication of the semiconductor chip 120 can be simplified and the number of input/output pads A' around the peripheral edges of first surface 122 of the semiconductor chip 120 can be decreased even as the trend for forming a more impact of the semiconductor chip 120.

Figure 4:
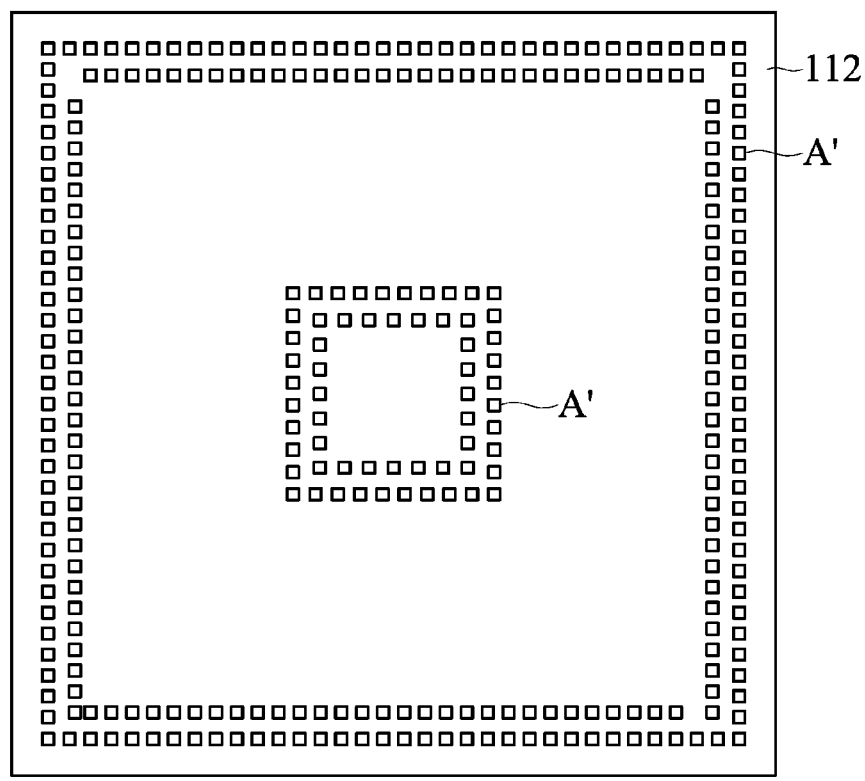
FIG. 4 is a schematic plane view of the semiconductor chip shown in FIG. 4.

FIG. 4 shows a schematic plane view of the first surface 122 of the semiconductor chip 120 shown in FIG. 3. As shown in FIG. 4, only the input/output pads A' formed on the first surface 122 of the semiconductor chip 120 are illustrated, for the purpose of simplicity.

As shown in FIG. 4, loose connective connections 134 (see FIG. 3) can be provided around the peripheral edges of first surface 122 of the semiconductor chip 120 to connect the input/output pads A' of the semiconductor chip 120 with the bonding pads B' formed over the package substrate 112. In addition, since additional input/output pads A' are provided over the central portion of the first surface 122 of the semiconductor chip 120. Therefore, the size of the package 100 can be reduced to accommodate more connections between input/output pads A' and the bonding pads B', which is desired as the trend for shrinking a size of the semiconductor package 100.

Moreover, in the semiconductor package 100, configuration of the input/output pads A' shown in FIGS. 3-4 allows shorter wire loop and IR drop effects can be reduced, so that more flexible IC designs for input/output pads can be achieved.

Figure 5:
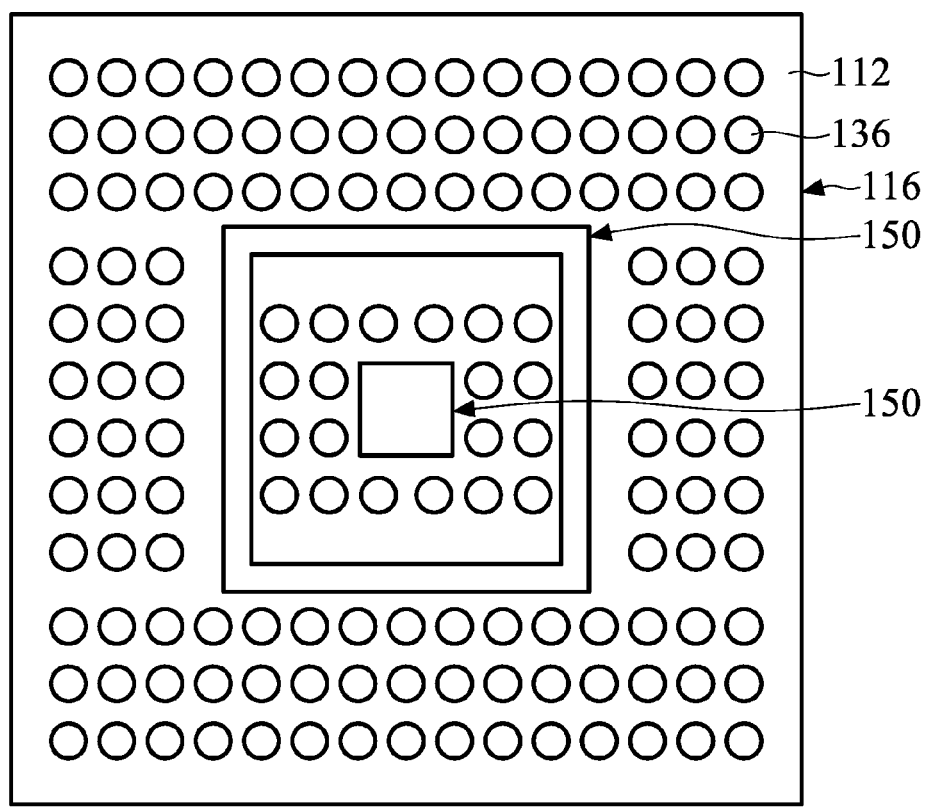
FIGS. 5-7 are schematic bottom views of the circuit board shown in FIG. 3.
Figure 6:
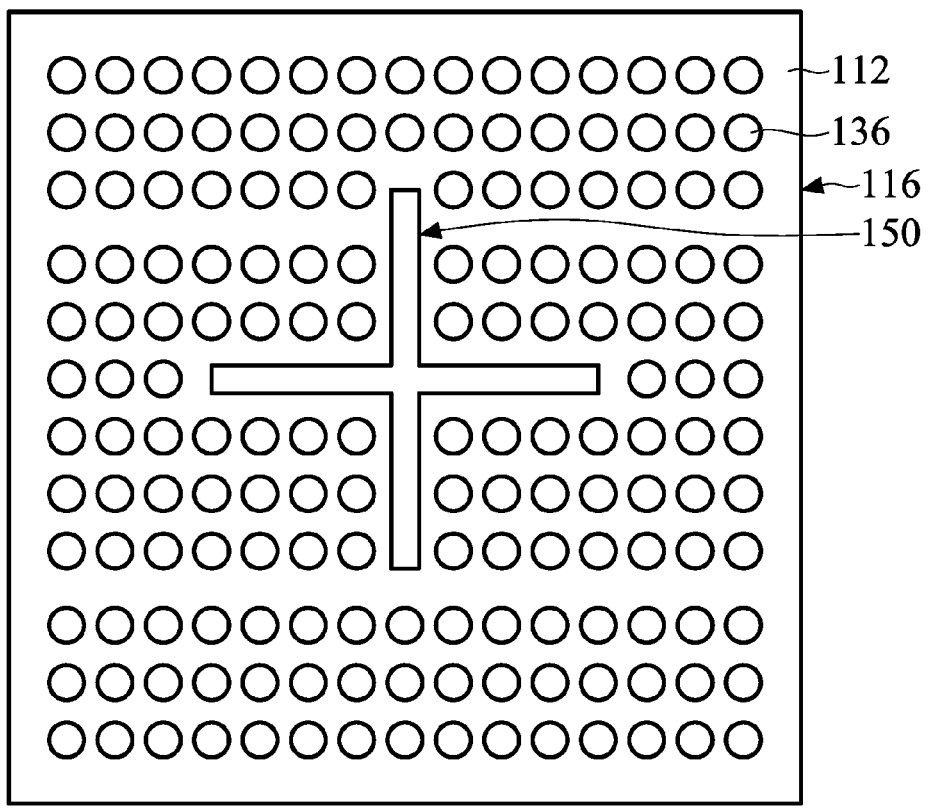
Figure 7:
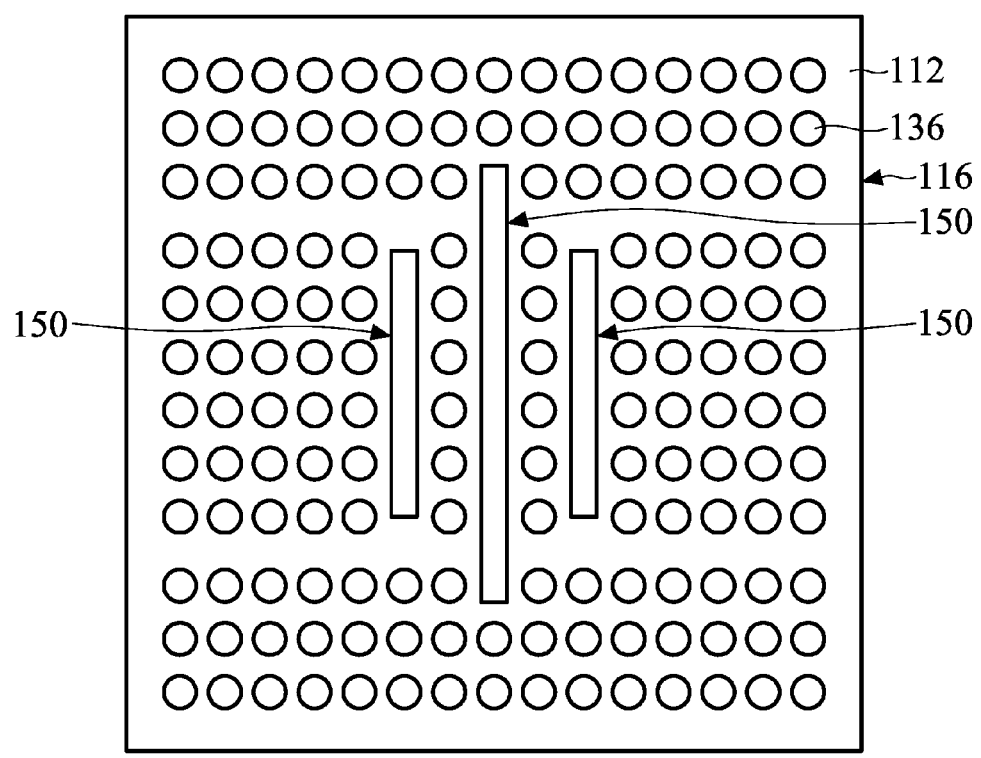

FIGS. 5-7 are various embodiments showing the layout of through holes formed in the circuit boards 112, and a second surface 116 of the circuit boards 112 having the bumps 136 formed thereon is illustrated.

As shown in FIG. 5, one of the through holes 150 having a rectangular shape is provided as the center of the circuit board 112, and the other through holes 150 form a continuous rectangular trench surrounding the through hole 150 with the rectangular shape and are apart from the through hole 150 with the rectangular shape.

In addition, as shown in FIG. 6, the through holes 150 are provided as a crisscross configuration on the second surface 116 of the circuit board 112.

Moreover, as shown in FIG. 7, the through holes 150 are provided as a plurality of parallel trenches isolated from each other by the circuit boards 112. As shown in FIG. 7, one of the through holes 150 can be formed as a first trench and the other through holes can be formed as second trenches at opposite side of the first trench.

In other embodiments, configurations of the through holes 150 can be adjusted further and can be other shapes according to various designs of the input/output pads A' of the semiconductor chip 120, and are not limited by those shown in FIGS. 5-7.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package, comprising:
   a circuit board comprising opposite first and second surfaces and a plurality of through holes;
   a semiconductor chip formed over a center portion of the first surface of the circuit board, having an active surface facing the circuit board, wherein the through holes comprise a first through hole exposing a center portion of the active surface of the semiconductor chip and a plurality of second through holes exposing a peripheral portion of the active surface of the semiconductor chip;
   a heat spreading layer formed over the semiconductor chip;

an encapsulant layer formed over the circuit board, covering heat spreading layer, the semiconductor chip, and the circuit board;
a plurality of conductive connections respectively passing through the through holes and electrically connecting the semiconductor chip with the circuit board; and
a plurality of conductive elements formed over the second surface of the circuit board.

2. The semiconductor package as claimed in claim 1, wherein the encapsulant layer does not physically contact the active surface of semiconductor chip.

3. The semiconductor package as claimed in claim 1, further comprising a first adhesive layer formed between the first surface of the circuit board and the active surface of the semiconductor chip.

4. The semiconductor package as claimed in claim 1, wherein the encapsulant layer is further formed between the heat spreading layer and the semiconductor chip.

5. The semiconductor package as claimed in claim 1, wherein the semiconductor chip is a functional chip.

6. The semiconductor package as claimed in claim 1, wherein the heat spreading layer comprises copper or aluminum.

7. The semiconductor package as claimed in claim 1, wherein the encapsulant layer comprises resin material.

8. The semiconductor package as claimed in claim 1, further comprising another encapsulant layer fills the through holes and covers the conductive connections.

9. The semiconductor package as claimed in claim 1, wherein the through holes comprise a first through hole exposing a center portion of the active surface of the semiconductor chip and a plurality of second through holes exposing a peripheral portion of the active surface of the semiconductor chip.

10. The semiconductor package as claimed in claim 9, wherein the circuit board comprises a stair-like portion, wherein the stair-like portion has a plurality of sub-layers formed vertically between the first surface and the second surface of the circuit board and exposed by one of the plurality of second through holes.

11. The semiconductor package as claimed in claim 10, wherein the stair-like portion is positioned in a peripheral portion of the circuit board, which is close to the peripheral portion of the active surface of the semiconductor chip.

12. The semiconductor package as claimed in claim 9, wherein the second through holes are formed at a side of the first through hole.

13. The semiconductor package as claimed in claim 9, wherein the first through hole is formed as a first trench and the second through holes are formed as second trenches at opposite sides of the first trench on the second surface of the circuit board.

14. The semiconductor package as claimed in claim 9, wherein the first and second through holes are formed with a crisscross configuration on the second surface of the circuit board.

15. The semiconductor package as claimed in claim 9, wherein the first through hole comprises a rectangular through hole and the second through hole forms a continuous rectangular trench surrounding the first through hole on the second surface of the circuit board.

16. A semiconductor package, comprising:
a circuit board comprising opposite first and second surfaces and a plurality of through holes;
a semiconductor chip formed over a center portion of the first surface of the circuit board, having an active surface facing the circuit board;
a heat spreading layer formed over the semiconductor chip;
an encapsulant layer formed over the circuit board, covering heat spreading layer, the semiconductor chip, and the circuit board;
a plurality of conductive connections respectively passing through the through holes and electrically connecting the semiconductor chip with the circuit board, wherein the circuit board comprises a stair-like portion, wherein the stair-like portion has a plurality of sub-layers formed vertically between the first surface and the second surface of the circuit board and exposed by one the plurality of through holes.

17. The semiconductor package as claimed in claim 16, wherein the through holes comprise a first through hole exposing a center portion of the active surface of the semiconductor chip and a plurality of second through holes exposing a peripheral portion of the active surface of the semiconductor chip.

18. The semiconductor package as claimed in claim 17, wherein the plurality of sub-layers of the stair-like portion is exposed by one of the plurality of second through holes.

19. The semiconductor package as claimed in claim 18, wherein the stair-like portion is positioned in a peripheral portion of the circuit board, which is close to the peripheral portion of the active surface of the semiconductor chip.

20. The semiconductor package as claimed in claim 16, wherein the sub-layers of the stair-like portion are not coplanar with the first surface and the second surface of the circuit board.

21. The semiconductor package as claimed in claim 17, wherein the first and second through holes are formed with a crisscross configuration on the second surface of the circuit board.

22. The semiconductor package as claimed in claim 17, wherein the first through hole comprises a rectangular through hole and the second through hole forms a continuous rectangular trench surrounding the first through hole on the second surface of the circuit board.

23. A semiconductor package, comprising:
a circuit board comprising opposite first and second surfaces and a plurality of through holes;
a semiconductor chip formed over a center portion of the first surface of the circuit board, having an active surface facing the circuit board;
a plurality of conductive connections respectively passing through the through holes and electrically connecting the semiconductor chip with the circuit board, wherein the circuit board comprises a stair-like portion, wherein the stair-like portion has a plurality of sub-layers formed vertically between the first surface and the second surface of the circuit board and exposed by one the plurality of through holes, and wherein
one of the plurality of conductive connections electrically connects a bonding pad disposed on one of the plurality of sub-layers.

24. The semiconductor package as claimed in claim 23, wherein the through holes comprise a first through hole exposing a center portion of the active surface of the semiconductor chip and a plurality of second through holes exposing a peripheral portion of the active surface of the semiconductor chip.

25. The semiconductor package as claimed in claim 24, wherein the plurality of sub-layers of the stair-like portion is exposed by one of the plurality of second through holes.

26. The semiconductor package as claimed in claim 25, wherein the stair-like portion is positioned in a peripheral portion of the circuit board, which is close to the peripheral portion of the active surface of the semiconductor chip.

27. The semiconductor package as claimed in claim 23, wherein the sub-layers of the stair-like portion are not coplanar with the first surface and the second surface of the circuit board.

28. The semiconductor package as claimed in claim 24, wherein the first and second through holes are formed with a crisscross configuration on the second surface of the circuit board.

29. The semiconductor package as claimed in claim 24, wherein the first through hole comprises a rectangular through hole and the second through hole forms a continuous rectangular trench surrounding the first through hole on the second surface of the circuit board.

* * * * *